United States Patent
Iadanza

(10) Patent No.: US 8,711,022 B2
(45) Date of Patent: Apr. 29, 2014

(54) RESISTOR-2 RESISTOR (R-2R) DIGITAL-TO-ANALOG CONVERTER WITH RESISTOR NETWORK REVERSAL

(75) Inventor: Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 13/526,915

(22) Filed: Jun. 19, 2012

(65) Prior Publication Data

US 2013/0335249 A1 Dec. 19, 2013

(51) Int. Cl.
*H03M 1/78* (2006.01)

(52) U.S. Cl.
USPC .......................... 341/154; 341/161; 341/144

(58) Field of Classification Search
USPC .................... 341/144, 145, 154, 161
See application file for complete search history.

(56) References Cited

U.S. PATENT DOCUMENTS

| | | | |
|---|---|---|---|
| 4,338,591 A | 7/1982 | Tuthill | |
| 5,493,300 A * | 2/1996 | Eiler et al. | 341/154 |
| 5,648,780 A * | 7/1997 | Neidorff | 341/154 |
| 7,233,274 B1 * | 6/2007 | Kuhn | 341/161 |
| 7,238,082 B2 * | 7/2007 | Saxler et al. | 451/5 |
| 7,256,721 B2 | 8/2007 | Copley | |
| 7,317,413 B2 | 1/2008 | Lee | |
| 7,362,253 B2 * | 4/2008 | Ko | 341/144 |
| 7,414,561 B1 | 8/2008 | Brubaker | |
| 7,554,475 B2 * | 6/2009 | Ginosar et al. | 341/154 |
| 8,013,772 B2 | 9/2011 | Li | |
| 2001/0033242 A1 * | 10/2001 | Castaneda et al. | 341/154 |
| 2004/0257254 A1 * | 12/2004 | Jiang et al. | 341/145 |

* cited by examiner

*Primary Examiner* — Jean B Jeanglaude
(74) *Attorney, Agent, or Firm* — David Cain; Roberts Mlotkowski Safran & Cole, P.C.

(57) ABSTRACT

A resistor-2 resistor (R-2R) digital-to-analog converter with resistor network reversal and methods of use are disclosed. A circuit includes a plurality of resistor stacks and a plurality of separation resistors which separate the resistor stacks. The circuit further includes a plurality of selection devices connected to a respective one of the plurality of resistor stacks. The circuit also includes a first termination resistor stack connected to a drain of a first resistor stack of the plurality of resistor stacks and a second termination resistor stack connected to a drain of a last resistor stack of the plurality of resistor stacks. The circuit further includes a first switch connected to the drain of the first resistor stack of the plurality of resistor stacks and an output. The circuit also includes a second switch connected to the drain of the last resistor stack of the plurality of resistor stacks and the output.

21 Claims, 7 Drawing Sheets

RESISTOR-2 RESISTOR (R-2R) DIGITAL-TO-ANALOG CONVERTER WITH RESISTOR NETWORK REVERSAL

FIELD OF THE INVENTION

The invention relates to semiconductor structures and, more particularly, to a resistor-2 resistor (R-2R) digital-to-analog converter with resistor network reversal and methods of use.

BACKGROUND

In order to implement human-computer interfaces such as display monitors and audio outputs, computer systems employ digital-to analog (DAC) circuits, which convert digital vectors or addresses to an analog voltage or current. Additionally, DAC circuits are used in a plethora of applications within integrated circuits (ICs) to control, tune, calibrate, or test larger more complex systems.

Simulations are used to establish a minimum voltage $V_{min}$ and a maximum voltage $V_{max}$, as defined by equations (1) and (2), respectively, at a DAC output.

$$V_{min} = \text{DAC output with the digital address input minimized} \quad \text{Equation (1); and}$$

$$V_{max} = \text{DAC output with the digital address input maximized} \quad \text{Equation (2).}$$

These voltages $V_{max}$, $V_{min}$ are used to calculate an expected DAC output voltage $VOUT_{EXPECT}$, as defined by equations (3)-(5), at each digital address value and an expected change in output voltage value between two digital addresses that differ by one bit.

$$VOUT_{EXPECT} = (LSB*\text{BIN2DEC(Digital Address)}) + V_{min} \quad \text{Equation (3);}$$

$$LSB = (V_{max} - V_{min})/\text{MAXSTEPS} \quad \text{Equation (4); and}$$

$$\text{MAXSTEPS} = (2^N - 1), \text{ where } N = \text{a width of a digital address vector} \quad \text{Equation (5).}$$

Once data for these calculations is taken, the digital address is stepped from its minimum value to its maximum value in one bit increments while measuring the output voltage at each step. An ideal DAC output is a stair-step where each plateau or tread represents a voltage equivalent of a digital address input, and a voltage output rises as the digital address input increments from its lowest value to its highest value.

These calculations are also used to determine three measures of DAC circuit quality: (i) integral non-linearity (INL), as defined by equation (6); (ii) differential non-linearity (DNL), as defined by equation (7); and (iii) monotonicity of the circuit. Illustratively, $$INL = (VOUT_{MEASURED} - VOUT_{EXPECT})/LSB \quad \text{Equation (6); and}$$

$$DNL = (VOUT_{MEASURED(ADDRESS)} - VOUT_{MEASURED(ADDRESS-1)})/LSB \quad \text{Equation (7).}$$

INL is a measurement of how closely a voltage measurement at a DAC output matches predicted values at each address step, i.e., when a digital address increases by one bit. DNL is a measurement of how closely the measured voltage step between two consecutive addresses matches the ideal LSB step value computed for the DAC measured at each address step. INL and DNL values between +/−1.0 LSB are desirable. The DAC is monotonic when a direction of a DAC output voltage changes in the same direction as the change of a digital address change, i.e., when the digital address increases, the DAC output voltage increases, and vice-versa.

Example DAC circuits include a ladder DAC and R-2R DAC. A ladder DAC includes a series of resistors, e.g., a resistor ladder, placed between an upper reference voltage supply and ground, or alternatively, a lower reference voltage supply. The resistor ladder sinks current between the voltage supply and ground, and acts as a multiple-tap voltage divider. Selection switches at each resistor connection point selectively connect a ladder node to an output node of the DAC based on the digital address. In implementation, the ladder DAC requires at least $2^N$ resistors and $2^N$ selection elements, where N is the number of bits in the digital address. Although ladder DACs provide good INL, DNL and monotonic performance, physical implementations become large, and an effective impedance between the voltage supply, ground, and a DAC output increases as the number of bits increases, thus limiting transient performance.

The R-2R DAC includes a plurality of resistor stacks separated by a separation resistor. Each bit of the digital address determines whether a source terminal of a resistor stack unique to that digital address bit is driven from either the voltage supply or ground, or alternatively, a lower reference voltage supply. A drain of a resistor stack associated with a most-significant-bit (MSB) is connected to the DAC output. In addition, the R-2R DAC includes a resistor stack disposed between ground and a drain of a resistor stack associated with a least-significant-bit.

An R-2R DAC is efficient in its use of resistors and selection elements. More specifically, the number of resistors required is determined by (3*N)+1 and the number of selection elements is determined by 2*N, where N is the number of digital address bits. Thus, R-2R DACs compare favorably to ladder DACs in terms of silicon area and impedance between the voltage supply, ground, and the DAC output, resulting in faster transient response.

Worst case INL and DNL values occur at a half-address switch, e.g., for example, in a 7-bit DAC, the half address switch occurs when a digital address switches from 0111111 to 1000000. This is because of an error between an actual resistance value of the resistor stack, e.g., the resistor stack associated with the MSB, due to device mismatch and an ideal value of the resistor stack. As a result, the error swings a voltage of the DAC in opposite directions at the half address switch. Thus, at the half address switch, the DAC output step may be less than the value expected for the LSB and in some cases, may decrease rather than increasing as expected. Thus, the DAC then becomes non-monotonic at the half-address switch.

Although, R-2R DACs with larger resistors provide desirable INL and DNL performance, the area of the resistors far outweighs the area required to implement selection devices, e.g., transistors, for decode logic of an R-2R DAC. Therefore, the large resistor size is a negative in terms of integration/use in larger analog structures. However, R-2R DACs with a smaller resistor area yield undesirable DNL values. Further, similar to the R-2R DAC with larger resistors, the worst case INL and DNL performance occurs at the half address switch. More specifically, at the half address switch, the R-2R DAC then becomes non-monotonic.

Accordingly, there exists a need in the art to overcome the deficiencies and limitations described hereinabove.

BRIEF SUMMARY

In an aspect of the invention, a circuit comprises a plurality of resistor stacks and a plurality of separation resistors which separate the resistor stacks. The circuit further comprises a plurality of selection devices connected to a respective one of the plurality of resistor stacks. The circuit also comprises a first termination resistor stack connected to a drain of a first resistor stack of the plurality of resistor stacks and a second termination resistor stack connected to a drain of a last resistor stack of the plurality of resistor stacks. The circuit further comprises a first switch connected to the drain of the first resistor stack of the plurality of resistor stacks and to an output. The circuit further comprises a second switch connected to the drain of the last resistor stack of the plurality of resistor stacks and to the output.

In an aspect of the invention, a circuit comprises a plurality of resistor stacks and a plurality of separation resistors which separate the resistor stacks. The circuit further comprises a first termination resistor stack connected to a drain of a first resistor stack of the plurality of resistor stacks and a second termination resistor stack connected to a drain of a last resistor stack of the plurality of resistor stacks. The circuit also comprises one or more switches connected to a respective drain of one of the plurality of resistor stacks.

In an aspect of the invention, a method comprises receiving a most-significant-bit of a digital address at a plurality of respective selection devices as a selection signal. The method also comprises flipping between a first resistor stack and a last resistor stack to convert the most-significant-bit into an analog signal based on a value of the most-significant-bit.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an R-2R digital-to-analog converter with resistor network reversal, which comprises the structures of the present invention. In still further embodiments, a method in a computer-aided design system is provided for generating a functional design model of the R-2R digital-to-analog converter with resistor network reversal. The method comprises generating a functional representation of the structural elements of the R-2R digital-to-analog converter with resistor network reversal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to an R-2R digital-to-analog converter (DAC) with resistor network reversal and methods of use. In embodiments, the DAC with resistor network reversal includes a plurality of resistor stacks separated by a separation resistor. Additionally, the DAC with resistor network reversal includes a first termination resistor stack connected to a drain of a first resistor stack of the plurality of resistor stacks and a second termination resistor stack connected to a drain of a last resistor stack of the plurality of resistor stacks. These termination resistor stacks are connected to ground, or alternatively, a lower reference voltage supply by a respective selection gate.

Further, in embodiments, the DAC with resistor network reversal includes a respective selection device connected to each of the plurality of resistor stacks. The DAC with resistor network reversal also includes a first switch connected to the drain of the first resistor stack of the plurality of resistor stacks, such that the first resistor stack is selectively coupled to an output of the DAC with resistor network reversal, and a second switch connected to the drain of the last resistor stack of the plurality of resistor stacks, such the last resistor stack is also selectively coupled to the output of the DAC with resistor network reversal.

The present invention advantageously provides for desirable DAC quality measures. More specifically, according to aspects of the present invention, these desirable quality measures can be achieved with a smaller resistor area, e.g., a resistor area of about 18% of an R-2R DAC having a resistor area of 28.8 µm². Further, the present invention advantageously provides for desirable INL and DNL performance at a half address switch by reversing which resistor stack handles the MSB. As a result, the present invention advantageously provides for monotonicity at all digital addresses.

Figure 1:
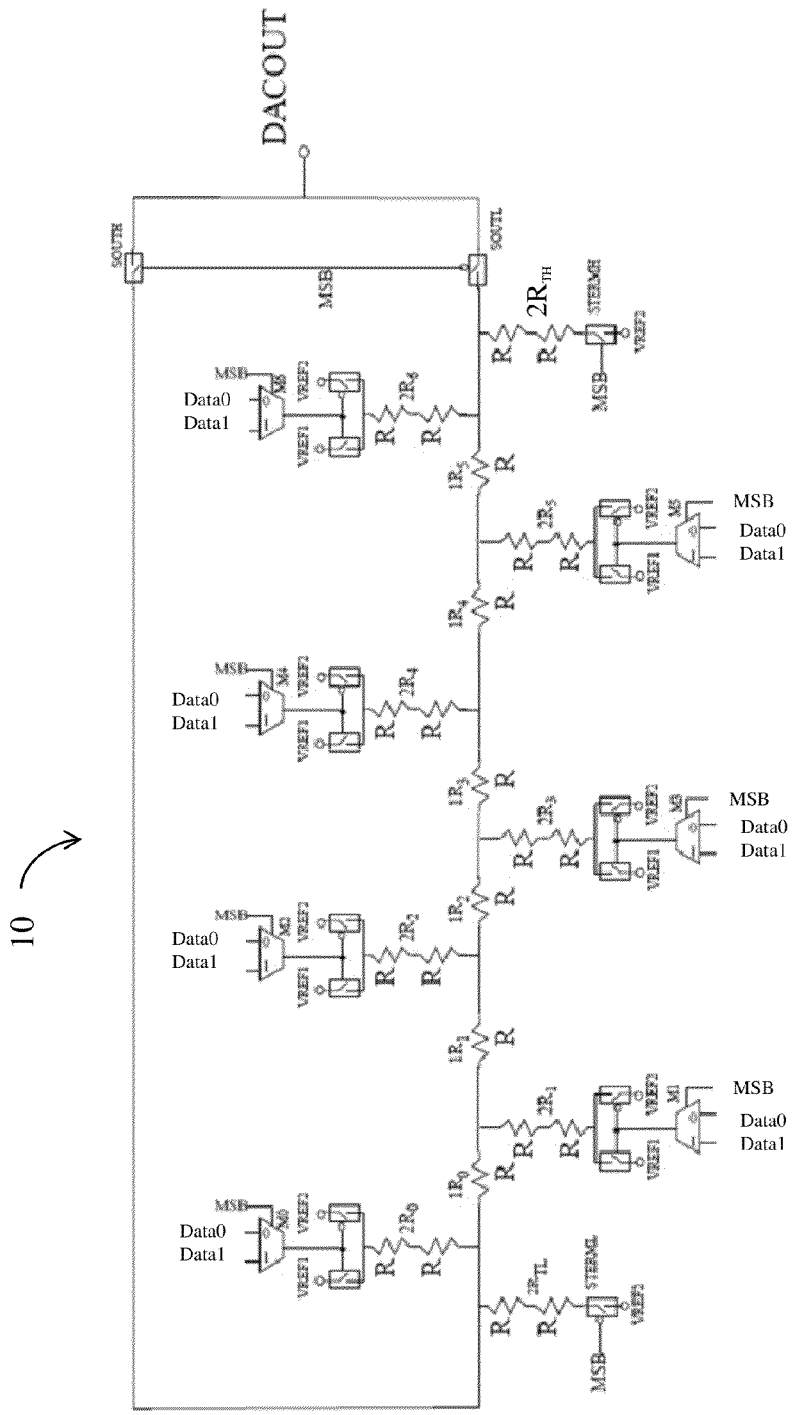
FIG. 1 shows an R-2R digital-to-analog converter (DAC) with resistor network reversal in accordance with aspects of the present invention.

FIG. 1 shows an R-2R digital-to-analog converter (DAC) with resistor network reversal in accordance with aspects of the present invention. More specifically, the R-2R DAC with resistor network reversal 10 includes a plurality of resistor stacks $2R_0$-$2R_6$. In embodiments, the resistor stacks $2R_0$-$2R_6$ include two resistors in series each having a resistance R. The resistor stacks $2R_0$-$2R_6$ are selectively coupled to a respective voltage supply VREF1 and ground VREF2.

In embodiments, the resistor stacks $2R_0$-$2R_6$ are separated by a separation resistor $1R_0$-$1R_5$. More specifically, resistor stack $2R_0$ is separated from resistor stack $2R_1$ by separation resistor $1R_0$, resistor stack $2R_1$ is separated from resistor stack $2R_2$ by separation resistor $1R_1$, etc. In embodiments, a DAC output DACOUT is selectively coupled to a drain of the resistor stack $2R_6$ and selectively coupled to a drain of the resistor stack $2R_0$. Although the DAC with resistor network reversal 10 of FIG. 1 is shown with seven resistor stacks, it should be understood by those of ordinary skill in the art that the present invention may be implemented with any number of resistor stacks depending on a length of the digital address.

Further, in embodiments, the DAC with resistor network reversal 10 includes a termination resistor stack $2R_{TL}$ connected to a drain of the resistor stack $2R_0$. In embodiments, the termination resistor stack $2R_{TL}$ includes two resistors having a resistance R. The termination resistor stack $2R_{TL}$ is further connected to a selection gate STERML, which is driven by a most-significant-bit (MSB). In this way, the selection gate STERML can be turned on or off. More specifically, in embodiments, when the MSB=0, the selection gate STERML is closed and the termination resistor stack $2R_{TL}$ is connected to ground VREF2. Alternatively, when MSB=1, the selection gate STERML is open and the termination resistor stack $2R_{TL}$ has a high impedance source connection.

In embodiments, the DAC with resistor network reversal 10 also includes a second termination resistor stack $2R_{TH}$ connected to a drain of the resistor stack $2R_6$. In embodiments, the second termination resistor stack $2R_{TH}$ includes two resistors having a resistance R. The second termination resistor stack $2R_{TH}$ is further connected to a second selection gate STERMH, which is also driven by the MSB. In this way, the second selection gate STERMH can be turned off and on. More specifically, in embodiments, when MSB=1, the second selection gate is closed and the termination resistor stack $2R_{TH}$ is connected to ground VREF2. Alternatively, when MSB=0, the second selection gate is open and the termination resistor stack $2R_{TH}$ has a high impedance source connection.

In embodiments, the resistor stacks $2R_0$-$2R_6$ are connected to a respective selection device M0-M6. In embodiments, the selection devices are 2-to-1 multiplexers. Further, in embodiments, the selection devices M0-M6 are selectively responsive to one of two different address inputs Data0, Data1 depending on the value of the MSB. More specifically, in embodiments, when MSB=0, the selection devices M0-M6 select the data input Data0 to control whether the resistor stacks $2R_0$-$2R_6$ are sourced from the voltage supply VREF1 or ground VREF2, e.g., selection device M0 selects the least-significant-bit to control resistor stack $2R_0$, selection device M1 selects the least-significant-bit +1 to control resistor stack $2R_1$, etc. For example, when MSB=0 and the least-significant-bit is 0, the resistor stack $2R_0$ is sourced from ground VREF2; whereas, when MSB=0 and the least-significant-bit is 1, the resistor stack $2R_0$ is sourced from the voltage supply VREF1.

In contrast, in embodiments, when MSB=1, the selection devices M0-M6 select data input Data1 to control whether the resistor stacks $2R_0$-$2R_6$ are sourced from the voltage supply VREF1 or ground VREF2, e.g., selection device M0 selects the MSB to control resistor stack $2R_0$, selection device M1 selects the MSB−1 to control resistor stack $2R_1$, etc. For example, when MSB=1 and the least-significant-bit is 0, the resistor stack $2R_6$ is sourced from ground VREF2; whereas, when MSB=1 and the least-significant-bit is 1, the resistor stack $2R_6$ is sourced from the voltage supply VREF1. In this way, when MSB=0, the DAC with resistor network reversal 10 functions like a conventional DAC, i.e., the least-significant-bit is on the left and the MSB is on the right. However, when MSB=1, the DAC with resistor network reversal 10 functions like a reversed conventional DAC, i.e., the least-significant-bit is on the right and the MSB is on the left.

Additionally, in embodiments, the DAC with resistor network reversal 10 includes switches SOUTH and SOUTL. More specifically, the switch SOUTH is connected to a common node between the resistor stack $2R_0$ and the resistor stack $2R_{TL}$, and the switch SOUTL is connected to a common node between the resistor stack $2R_6$ and the resistor stack $2R_{TH}$. In embodiments, the switches SOUTH, SOUTL are controlled by the MSB. More specifically, when MSB=0, the switch SOUTL is closed and switch SOUTH is open. In this way, the drain of the resistor stack $2R_6$ is connected to the DAC output DACOUT and functions as the resistor stack associated with the MSB. Thus, when MSB=0, the DAC with resistor network reversal 10 functions like a conventional DAC, i.e., the DAC output DACOUT is on the right. However, when MSB=1, the switch SOUTL is open and the switch SOUTH is closed. In this way, the drain of the resistor stack $2R_0$ is connected to the DAC output DACOUT and functions as the resistor stack associated with the MSB. Thus, when MSB=1, the DAC with resistor network reversal 10 functions like a reversed conventional DAC, i.e., the DAC output DACOUT is on the left.

In this way, the R-2R DAC with resistor network reversal 10 utilizes the resistor stack $2R_0$ for the least-significant-bit and the resistor stack $2R_6$ for the MSB in a bottom half of the digital addresses, e.g., when MSB=0. During this time, an effect of mismatch between resistance in the resistor stack $2R_0$ and all other resistor stacks, e.g., resistor stacks $2R_1$-$2R_6$, is seen as the least-significant-bit toggles between 0 and 1. At or above the half address, e.g., when MSB=1, the use of the resistor stacks $2R_0$-$2R_6$ reverses.

More specifically, the resistor stack $2R_0$ is associated with the MSB and the resistor stack $2R_6$ is associated the least-significant-bit. In addition, the termination resistor stack associated with the least-significant-bit switches from the left side of the circuit, e.g., resistor stack $2R_{TL}$, to the right side of the circuit, e.g., resistor stack $2R_{TH}$. Further, the DAC output DACOUT is disconnected from the right side of the array and connected to the left side of the array. Because a portion of the device mismatch for $2R_0$ was seen in least-significant-bit toggling, use of the resistor stack $2R_0$ when MSB=1 does not contribute the full mismatch adder when the resistor stack $2R_6$ was used as the MSB, regardless of the MSB logic value.

In embodiments, the selection switches SOUTL, SOUTH are designed for full rail-to-rail voltage transmission. As a result, the switches SOUTL and SOUTH do not contribute to the mismatch performance of the circuit because once a transient event is accomplished, no current flows through the switches SOUTL and SOUTH, thus there is no voltage division as should be understood by those of ordinary skill in the art. Additionally, in embodiments, selection gates STERML, STERMH are balanced and contribute very little voltage drop. As a result, the addition of selection gate STERMH does not contribute significantly to the mismatch. Likewise, use of the second termination stack $2R_{TH}$ only has a nominal impact on mismatch because any mismatch in these resistors is mitigated by the depth of the resistor array between the resistor stack $2R_{TH}$ drain connection and the output as should be understood by those of ordinary skill in the art.

Further, in embodiments, the selection devices M0, M6 may be simplified such that the MSB functions as both the selection signal and one of the two data inputs, e.g., Data0 or Data1. In embodiments, the MSB functions as the selection signal and data input Data1 for selection device M0, and as such, the data input Data1 is selected when MSB=1. Accordingly, selection device M0 may be simplified by tying data input Data1 to 1, thus reducing logic using a karnaugh map. Similarly, in embodiments, the MSB functions as the selection signal and data input Data0 for selection device M6, and as such, the data input Data0 is selected when MSB=0. Accordingly, selection device M6 may be simplified by tying data input Data0 to 0, thus reducing a logic using a karnaugh map. In further embodiments, in an R-2R DAC with network reversal 10 with a digital address having an odd number of bits, a selection device for the middle address bit, e.g., selection device M3 of FIG. 1, can be removed as it will have the same address input regardless of the MSB value. That is, selection device M3 receives a same address bit regardless of the MSB value.

Figure 2:
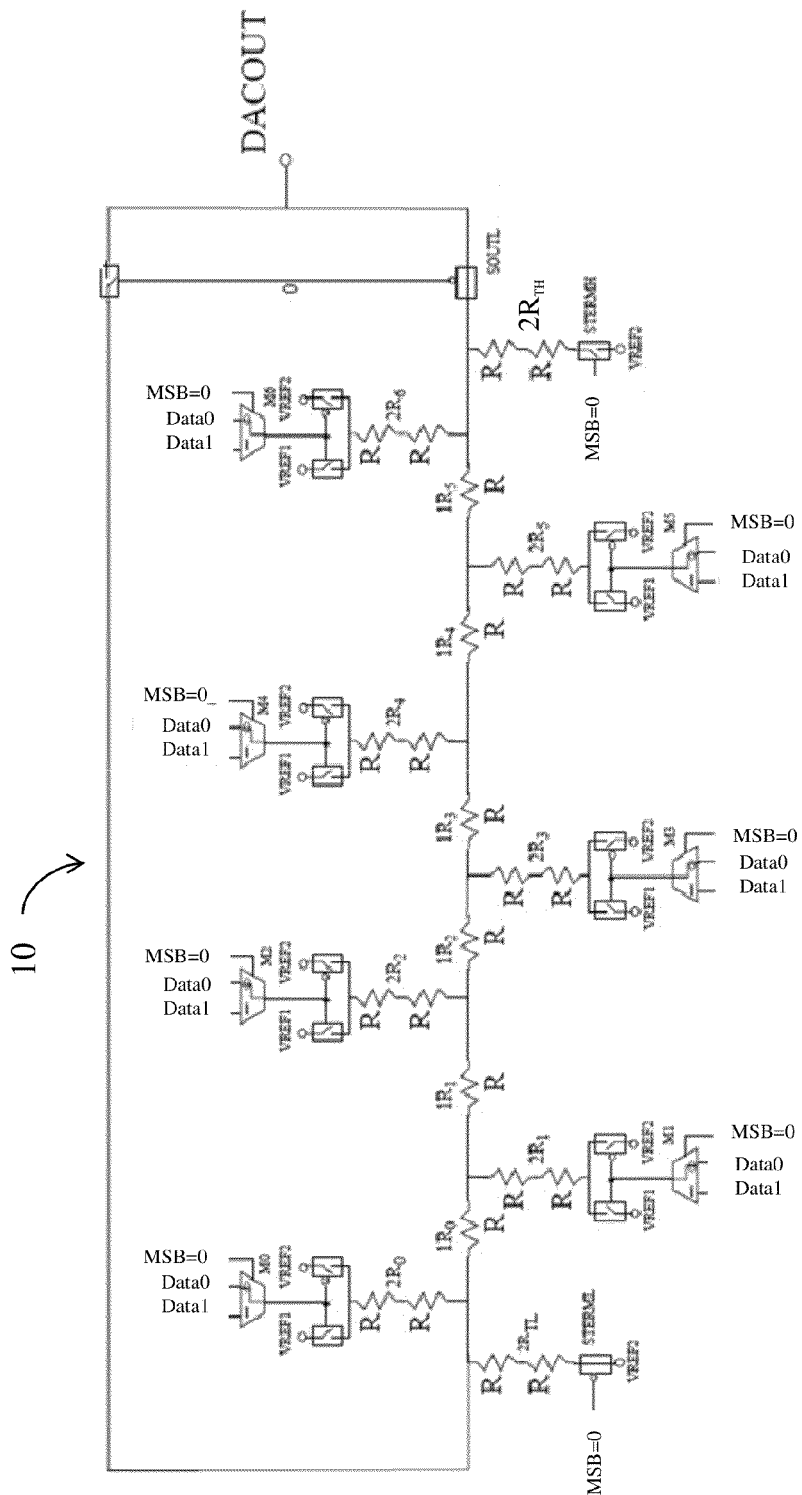
FIG. 2 shows the R-2R DAC with resistor network reversal configuration below a half address in accordance with aspects of the present invention.

FIG. 2 shows the R-2R DAC with resistor network reversal 10 below a half address in accordance with aspects of the present invention. More specifically, FIG. 2 shows a configuration of the R-2R DAC with resistor network reversal 10 when the MSB of the digital address input is 0. For example, the R-2R DAC with resistor network reversal 10 of FIG. 2 would be used for a seven bit digital address between 0000000 and 0111111. In this case, the resistor stack $2R_0$ is associated with the least-significant-bit and the resistor stack $2R_6$ is associated with the MSB. Further, in embodiments, the selection gate STERML is closed and the resistor stack $2R_{TL}$ functions as the termination resistor stack. Additionally, the selection gate STERMH is open such that the resistor stack $2R_{TH}$ is sourced by a high impedance source connection. In embodiments, the switch SOUTH is open and the switch SOUTL is closed. In this way, the DAC output DACOUT is connected to the drain of the resistor stack $2R_6$.

Figure 3:
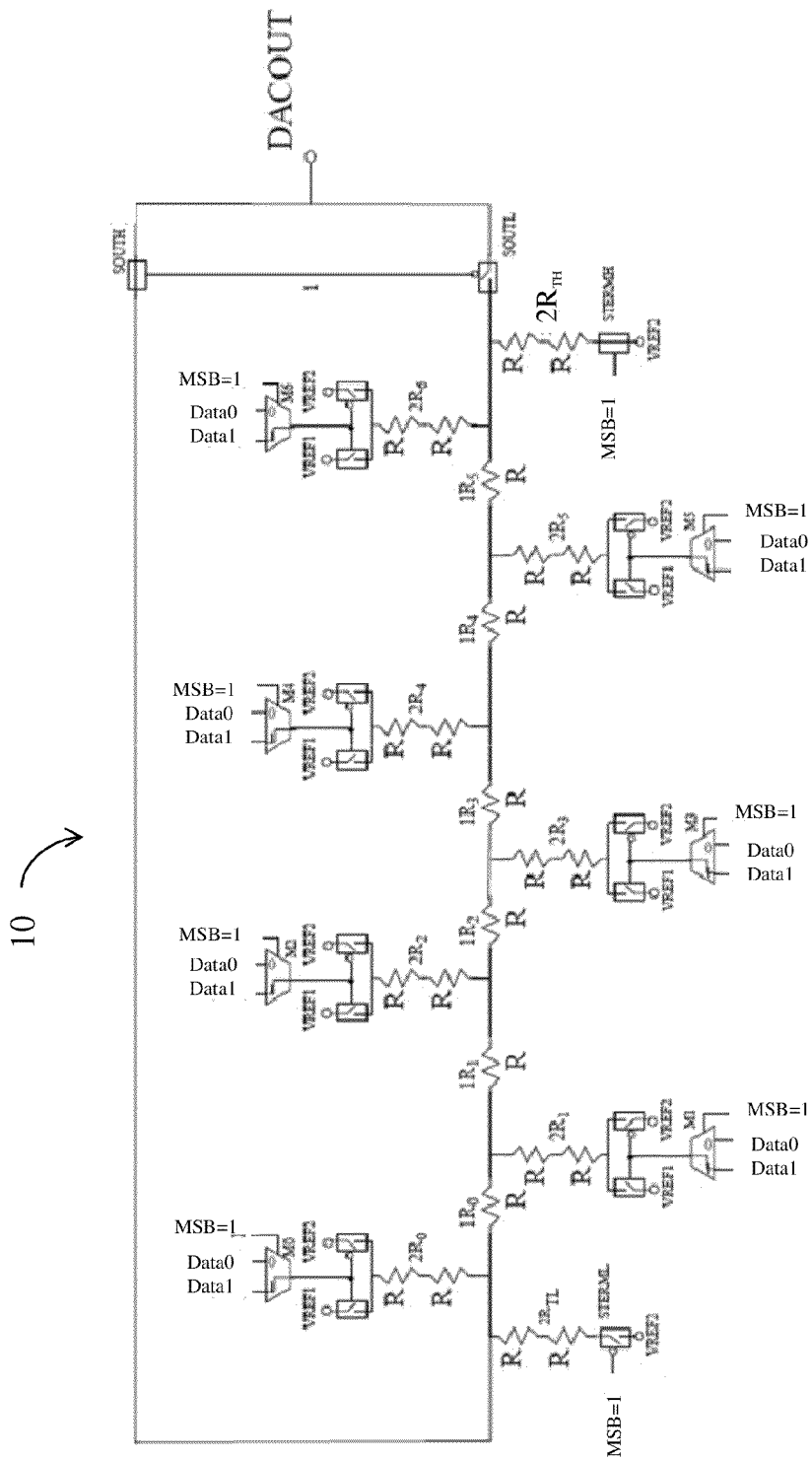
FIG. 3 shows the R-2R DAC with resistor network reversal configuration at or above the half address in accordance with aspects of the present invention.

FIG. 3 shows the R-2R DAC with resistor network reversal 10 at the half address and above in accordance with aspects of the present invention. More specifically, FIG. 3 shows a configuration of the R-2R DAC with resistor network reversal 10 when the MSB of the digital address input is 1. For example, the R-2R DAC with resistor network reversal 10 of FIG. 3 would be used for a seven bit digital address between 1000000 and 1111111. In this case, the resistor stack $2R_6$ is associated with the least-significant-bit and the resistor stack $2R_0$ is associated with the MSB. Further, in this state, the selection gate STERMH is closed and the resistor stack $2R_{TH}$ functions as the termination resistor stack. Additionally, the selection gate STERML is open such that resistor stack $2R_{TL}$ is sourced by a high impedance source connection. In embodiments, the switch SOUTL is open and the switch SOUTH is closed. In this way, the DAC output DACOUT is connected to the drain of the resistor stack $2R_0$. Accordingly, the DAC configuration of FIG. 3 functions as the reverse of the DAC configuration of FIG. 2.

Figure 4:
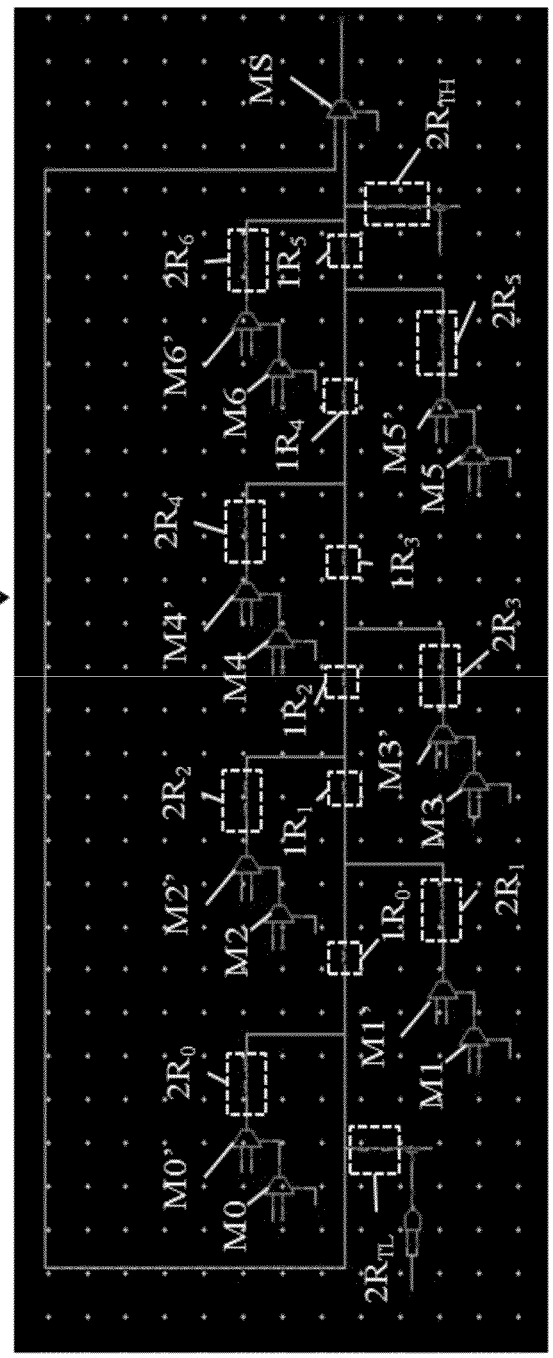
FIG. 4 shows a layout of a test bench used to conduct simulations of the R-2R DAC with resistor network reversal in accordance with aspects of the present invention.

FIG. 4 shows a layout of a test bench used to conduct simulations of the R-2R DAC with resistor network reversal 10 in accordance with aspects of the present invention. More specifically, using the test bench 20, simulations of the R-2R DAC with resistor network reversal 10 of FIG. 1 were conducted to determine the INL and DNL values of the R-2R DAC with resistor network reversal 10. The test bench 20 includes the plurality of resistor stacks $2R_0$-$2R_6$, which are separated by separation resistors $1R_0$-$1R_5$. As shown in FIG. 4, the test bench includes two 2-to-1 multiplexers associated with each of the plurality of resistor stacks $2R_0$-$2R_6$. That is, all addresses are modeled with a 2 mux structure. In embodiments, a first mux M0-M6 selects a correct address bit to control the respective resistor stack based on the MSB value, and the second MUX M0'-M6' converts the selected address value to either a voltage supply VREF1 or a ground VREF2 connection based on the address value. The test bench 20 further includes termination resistor stacks $2R_{TL}$ and $2R_{TH}$. In embodiments, the test bench includes a 2-to-1 mux MS which functions as a switch. During the simulations, ideal selection switches written in VerilogA were used to provide logic/source drive functions.

Additionally, simulations using conventional R-2R DACs with larger resistors yield desirable INL and DNL performance. For example, a conventional R-2R DAC having an area of about 28.8 $\mu m^2$, yields INL values of +/−0.281 LSB and DNL values of +/−0.563 LSB. The conventional R-2R DAC's peak INL and DNL values were reached at the half address switch. Further simulations using the same conventional R-2R DAC structure with a resistor area of about 18% of the original area of the R-2R DAC with the larger resistors yield INL values of +/−0.676 LSB and DNL values of +/−1.35 LSB. Similar to the R-2R DAC with larger resistors, the worst case INL and DNL performance occurs at the half address switch in the R-2R DAC with smaller resistors. To the contrary, in accordance with aspects of the present invention, the R-2R DAC with resistor network reversal 10 with a resistor area of about 18% of the R-2R DAC with the larger resistor provides for desirable INL and DNL values, as discussed with respect to FIGS. 5 and 6 below. Further, the R-2R DAC with resistor network reversal 10 confirms monotonicity at the half address switch.

Figure 5:
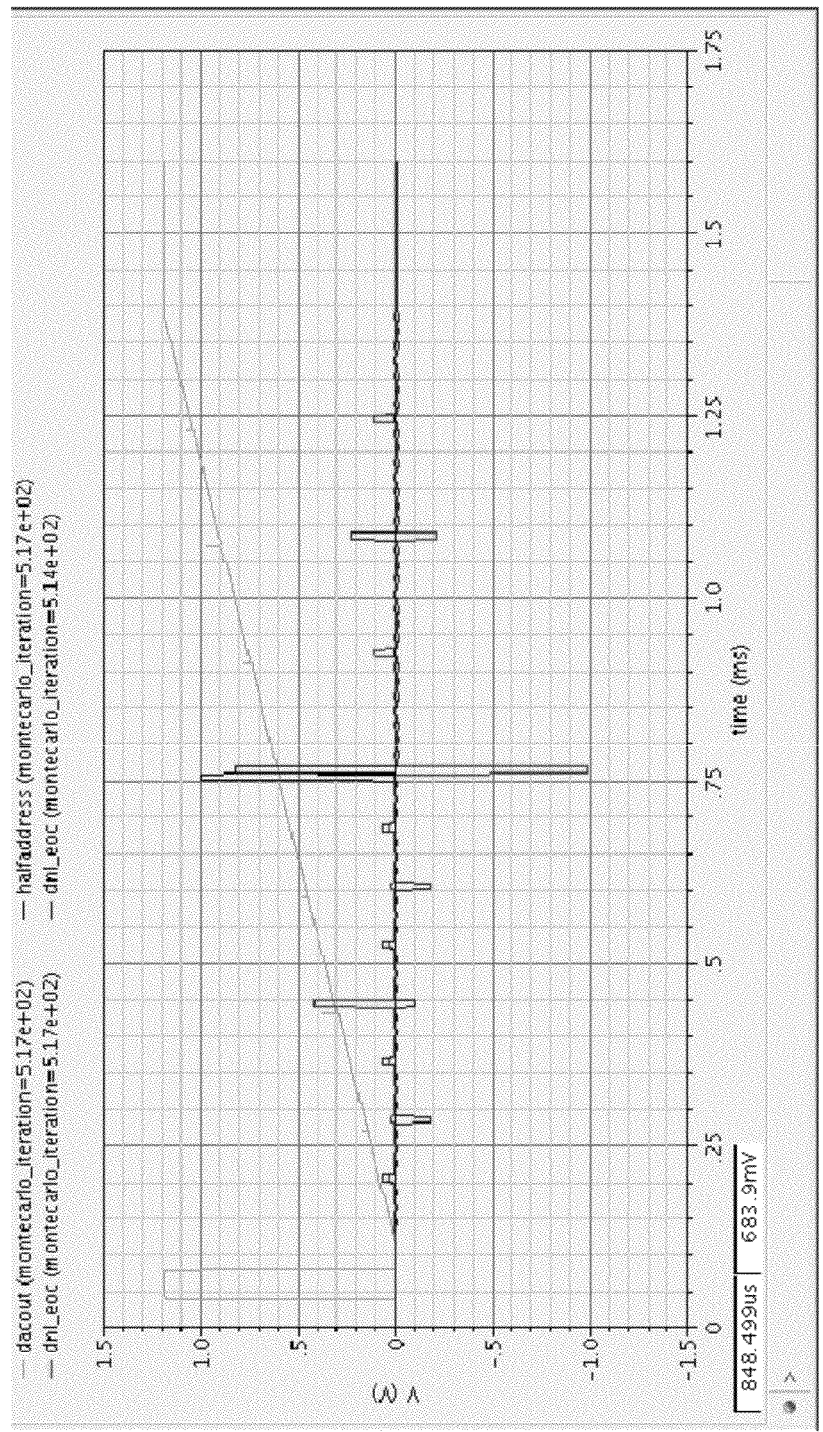
FIG. 5 shows a graph of DNL performance of the R-2R DAC with resistor network reversal in accordance with aspects of the present invention.

FIG. 5 shows a graph of the DNL performance of the R-2R DAC with resistor network reversal 10 in accordance with aspects of the present invention. More specifically, FIG. 5 shows the DNL values resulting from the simulations using the test bench 20 of FIG. 4. In embodiments, DNL values of about +/−1.0 LSB can be achieved as shown in FIG. 5. That is, according to aspects of the present invention, the R-2R DAC with resistor network reversal 10 advantageously provides for desirable DNL values and a smaller resistor area, e.g., a resistor area of about 18% of a conventional R-2R DAC having a resistor area of 28.8 $\mu m^2$.

Figure 6:
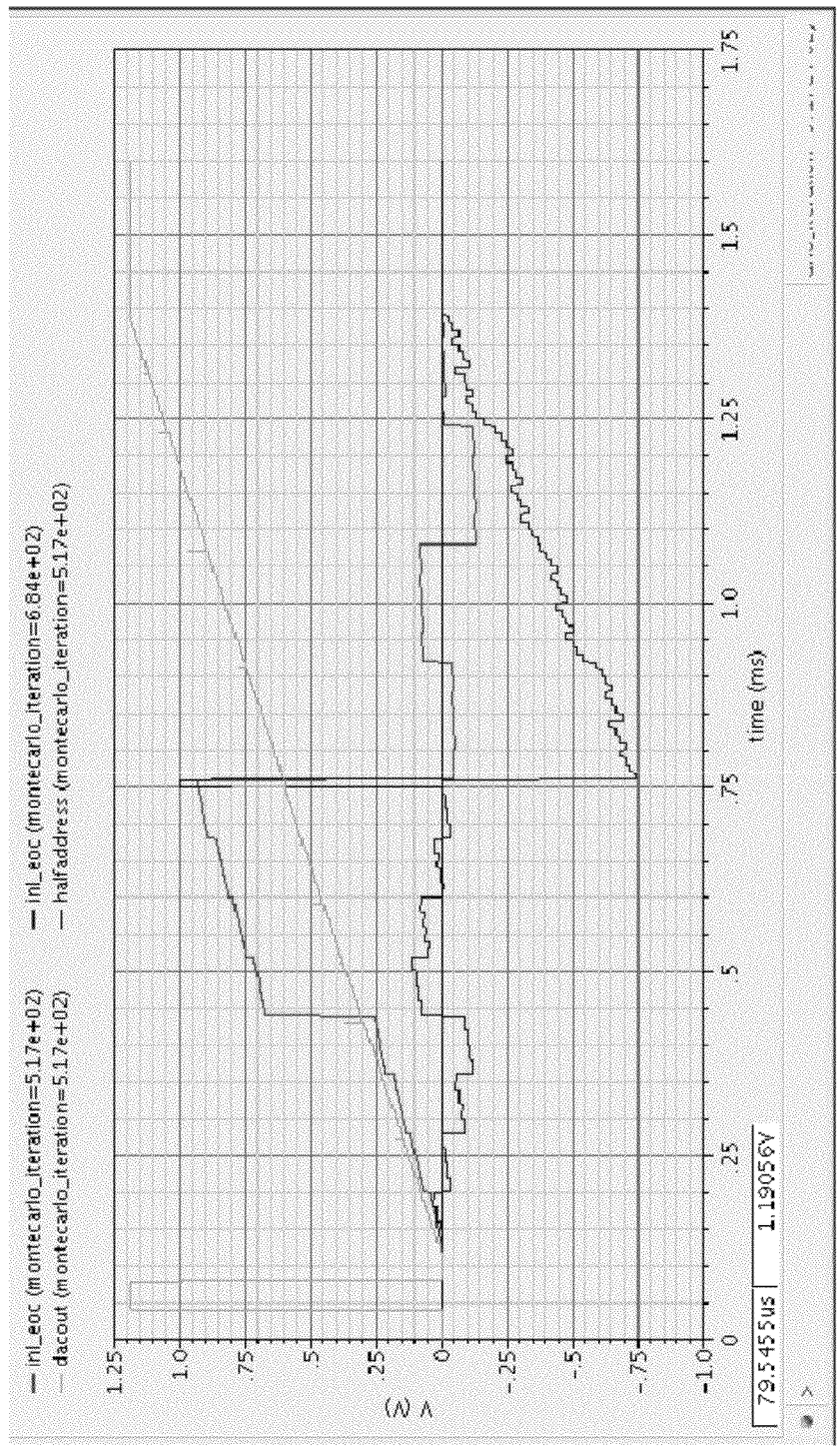
FIG. 6 shows a graph of the INL performance of the R-2R DAC with resistor network reversal in accordance with aspects of the present invention.

FIG. 6 shows a graph of the INL performance of the R-2R DAC with resistor network reversal 10 in accordance with aspects of the present invention. More specifically, FIG. 6 shows the INL values resulting from the simulations using the test bench 20 of FIG. 4. In embodiments, INL values of about +0.9353/−0.746 can be achieved as shown in FIG. 6. That is, according to aspects of the present invention, the R-2R DAC with resistor network reversal 10 advantageously provides for desirable INL values and a smaller resistor area, e.g., a resistor area of about 18% of a conventional R-2R DAC having a resistor area of 28.8 $\mu m^2$.

Figure 7:
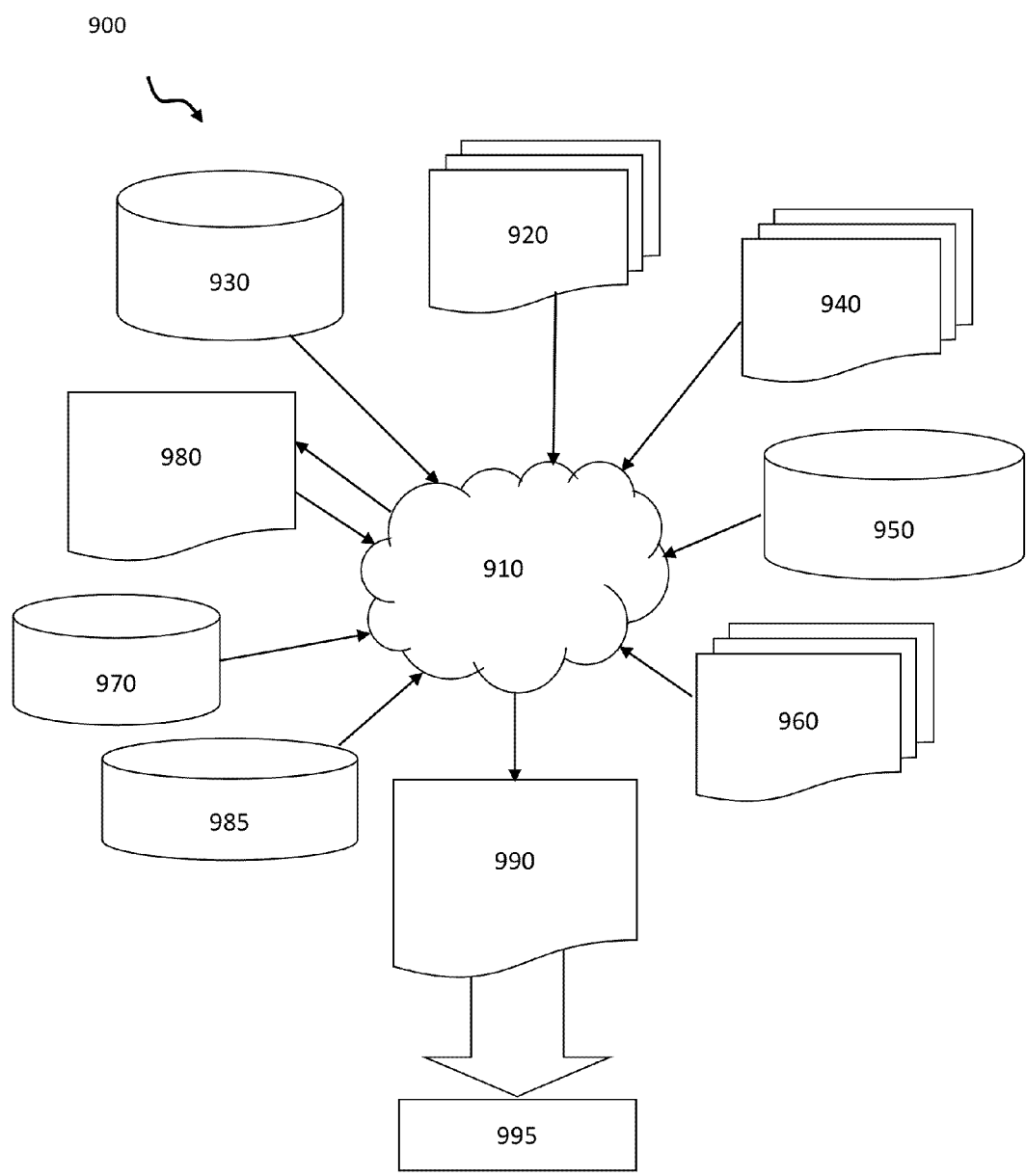
FIG. 7 is a flow diagram of a design process used in semiconductor design, manufacture, and/or test.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 990 may comprise a compiled, executable HDL simulation model that functionally simulates the devices shown in FIGS. 1-3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
a plurality of resistor stacks;
a plurality of separation resistors which separate the resistor stacks;
a plurality of selection devices connected to a respective one of the plurality of resistor stacks;
a first termination resistor stack connected to a drain of a first resistor stack of the plurality of resistor stacks;
a second termination resistor stack connected to a drain of a last resistor stack of the plurality of resistor stacks;
a first switch connected to the drain of the first resistor stack of the plurality of resistor stacks and to an output; and
a second switch connected to the drain of the last resistor stack of the plurality of resistor stacks and to the output.

2. The circuit of claim 1, wherein the plurality of selection devices are 2-to-1 multiplexers.

3. The circuit of claim 2, wherein the selection devices are selectively responsive to a first data input or a second data input based on a selection signal, wherein the selection signal is a most-significant-bit.

4. The circuit of claim 3, wherein:
when the most-significant-bit is 0, the plurality of selection devices select the first data input to determine a source of the resistor stacks; and
when the most-significant bit is 1, the plurality of selection devices select the second data to determine a source of the resistor stacks.

5. The circuit of claim 3, wherein the most-significant-bit functions as the selection signal and one of the data inputs.

6. The circuit of claim 5, wherein:
the first data input of the selection device for the first resistor stack of the plurality of resistor stacks is tied 1; and
the second data input of the selection device for the last resistor stack of the plurality of resistor stacks is tied to 0.

7. The circuit of claim 1, wherein:
the first termination resistor stack is connected to a first selection gate;
the second termination resistor stack is connected to a second selection gate; and
the first selection gate and the second selection gate being driven by a most-significant-bit.

8. The circuit of claim 7, wherein:
when the most-significant bit is 0:
the first selection gate is closed and the first termination resistor stack is connected to ground; and
the second selection gate is open and the second termination resistor stack has a high impedance source connection; and
when the most-significant-bit is 1:
the first selection gate is open and the first termination resistor stack has a high impedance source connection; and
the second selection gate is closed and the second termination resistor stack is connected to ground.

9. The circuit of claim 1, wherein the first switch and the second switch are controlled by a most-significant-bit.

10. The circuit of claim 9, wherein
when the most-significant-bit is 0, the second switch is closed and the first switch is open, such that the drain of the last resistor stack of the plurality of resistor stacks is connected to the output and functions as a resistor stack associated with the most-significant-bit; and
when the most-significant-bit is 1, the first switch is closed and the second switch is open, such that the drain of the first resistor stack of the plurality of resistor stacks is connected to the output and functions as the resistor stack associated with the most-significant-bit.

11. A circuit, comprising:
a plurality of resistor stacks;
a plurality of separation resistors which separate the resistor stacks;
a first termination resistor stack connected to a drain of a first resistor stack of the plurality of resistor stacks;
a second termination resistor stack connected to a drain of a last resistor stack of the plurality of resistor stacks; and
one or more switches connected to a respective drain of one of the plurality of resistor stacks.

12. The circuit of claim 11, wherein one or more resistor stacks of the plurality of resistor stacks is connected to a 2-to-1 multiplexer.

13. The circuit of claim 12, wherein when a number of resistor stacks is odd, a middle resistor stack of the plurality of resistor stacks is connected directly to a bit of a digital address.

14. The circuit of claim 12, further comprising:
a first selection gate coupled to the first termination resistor stack; and
a second selection gate coupled to the second termination resistor stack.

15. The circuit of claim 14, wherein the one or more switches comprises:
a first switch connected to the drain of the first resistor stack of the plurality of resistor stacks; and
a second switch connected to the drain of the last resistor stack of the plurality of resistor stacks.

16. The circuit of claim 15, wherein the first selection gate, the second selection gate, the first switch, and the second switch are controlled by a most-significant-bit.

17. The circuit of claim 16, wherein:
when the most-significant-bit is 0:
the first selection gate is closed and the first termination resistor stack is connected to ground;
the second selection gate is open and the second termination resistor stack has a high impedance source;
the first switch is open; and
the second switch is closed, such that the last resistor stack of the plurality of resistor stacks is connected to the output; and
when the most-significant-bit is 1:
the first selection gate is open and the first termination resistor stack has a high impedance source;
the second selection gate is ground and the second termination resistor stack is connected to ground;
the first switch is closed, such that the first resistor stack of the plurality of resistor stacks is connected to the output; and
the second switch is open.

18. A method, comprising:
receiving a most-significant-bit of a digital address at a plurality of selection devices as a selection signal; and
flipping between a first resistor stack and a last resistor stack to convert the most-significant-bit into an analog signal based on a value of the most-significant-bit.

19. The method of claim 18, wherein:
the first resistor stack converts the most-significant-bit into the analog signal when the most-significant-bit is 1; and
the last resistor stack converts the most-significant-bit into the analog signal when the most-significant-bit is 0.

20. The method of claim 19, further comprising:
connecting a first termination resistor stack to ground and closing a first switch when the most-significant-bit is 0; and
connecting a second termination resistor stack to ground and closing a second switch when the most-significant-bit is 1.

21. The method of claim 18, wherein the plurality of selection devices are a 2-to-1 multiplexers.

* * * * *